(12) United States Patent
Fujiwara

(10) Patent No.: US 6,342,849 B1
(45) Date of Patent: Jan. 29, 2002

(54) METHOD AND APPARATUS FOR PEAK DETECTION OF AN ANALOG SIGNAL

(75) Inventor: Emiko Fujiwara, Tokyo (JP)

(73) Assignee: Ando Electric Co., Ltd., Tokyo (JP)

(*) Notice: Subject to any disclaimer, the term of this patent is extended or adjusted under 35 U.S.C. 154(b) by 0 days.

(21) Appl. No.: 09/537,221

(22) Filed: Mar. 29, 2000

(30) Foreign Application Priority Data

Mar. 29, 1999 (JP) .............................. 11-086773

(51) Int. Cl.⁷ ................................ H03M 1/00
(52) U.S. Cl. ........................ 341/132; 341/155
(58) Field of Search ........................... 341/154, 132, 341/113; 327/117, 58, 145

(56) References Cited

U.S. PATENT DOCUMENTS 5,914,592 A * 6/1999 Saito .................. 324/121 R

\* cited by examiner

*Primary Examiner*—Peguy JeanPierre
(74) *Attorney, Agent, or Firm*—Oliff & Berridge, PLC

(57) ABSTRACT

A peak detecting device which can efficiently detect a peak of an analog signal in a smaller error for a short time without making a sampling frequency higher. The analog signal processing apparatus (1) as the peak detecting device comprises: the frequency-dividing ratio setting device (2) for outputting the frequency-dividing ratio setting signal (2a); the frequency divider (3) for frequency-dividing the frequency of the reference clock signal (1b) by the frequency-dividing ratio which is changed by the frequency-dividing ratio setting signal (2a), to generate the sampling clock signal (3a); the A/D converter (4) for carrying out the sampling of the analog input signal (1a) at the clock timing which is synchronized with the sampling clock signal (3a); the sampling data memory (5) for memorizing the digital data (4a) which are obtained by sampling by the A/D converter (4); and the data processor (6) for reading out the digital data (4a) as the digital data (5a), to determine the peak of the digital data (5a).

6 Claims, 2 Drawing Sheets

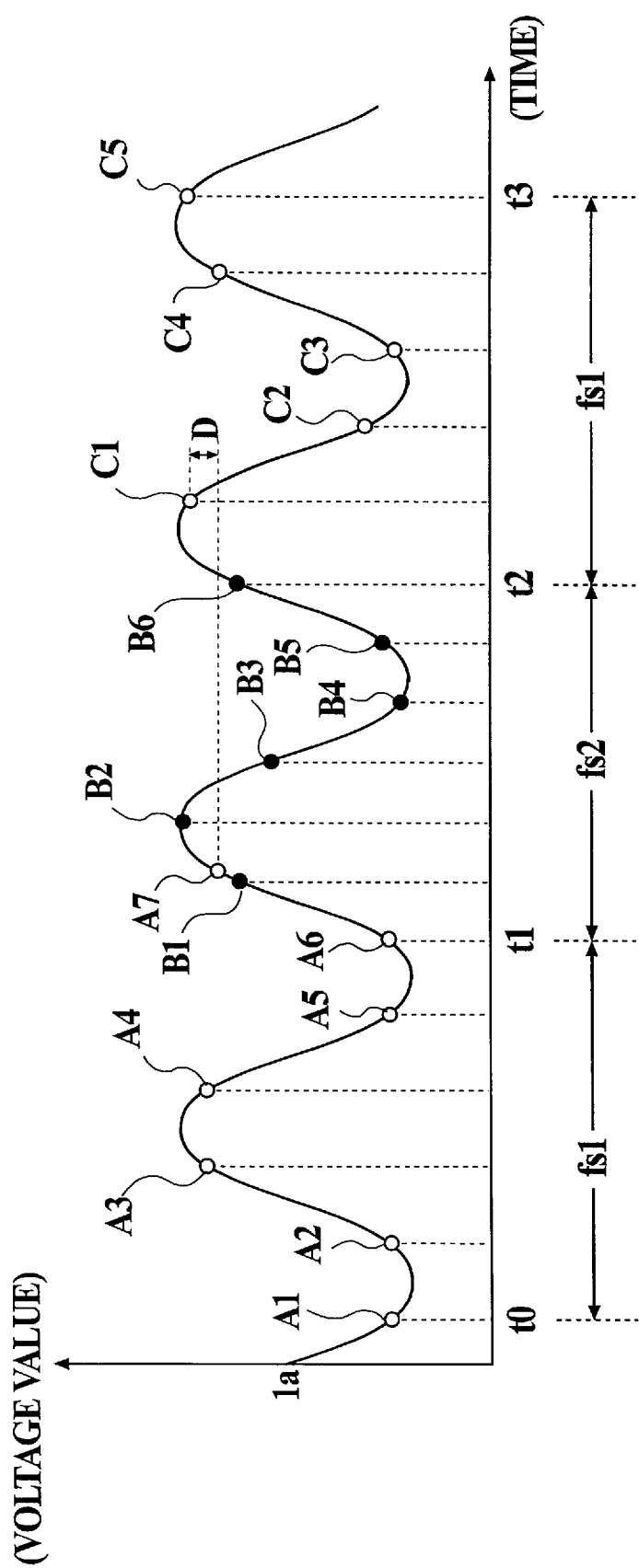

METHOD AND APPARATUS FOR PEAK DETECTION OF AN ANALOG SIGNAL

BACKGROUND OF THE INVENTION

1. Field of the Invention

The present invention relates to a peak detecting device and a peak detecting method for detecting a peak of an analog signal which is given from an outside.

2. Description of Related Art

In a device for carrying out at least one of various types of measures concerning an analog signal which is given from an outside, an A(Analog)/D(digital) converter carries out a process for sampling the analog signal by a predetermined sampling frequency to convert it to digital data. Thereafter, the digital data converted by the A/D converter are memorized in a memory which is called a sampling data memory temporarily, and are used for the following process.

However, according to the process by the above-described conventional A/D converter, the sampling frequency is decided regardless of a level change of the analog signal. Therefore, it is not necessarily that a timing for sampling the analog signal coincides with one of a peak of the analog signal. Accordingly, in order to detect the peak of the analog signal in a small error, various plans have been carried out.

In the above-described example, for example, a method for making the sampling frequency higher to increase the number of sampling the analog signal every unit time, has been known. In this case, the sampling of the analog signal is carried out every a shorter time, so that it becomes easier to detect the peak of the level of the analog signal.

Further, as disclosed in Japanese Patent Application Publication (Laid-open) No. Tokukai-hei 10-160507, the following method of sampling the analog signal, has been known. In the method, on the basis of the digital data obtained by sampling the analog signal, an operation by a predetermined complementary function is carried out to compute a complementary data. On the basis of the complementary data computed by the operation and the digital data obtained by sampling, the peak of the analog signal is determined by the operation. Accordingly, according to the method, it is possible to detect the peak of the analog signal more correctly, without making the sampling frequency higher.

However, according to the above-described conventional method, it was necessary to use the hardware having the much higher performance, so that there was a problem to require the higher production cost for it.

That is, in the above-described method of making the sampling frequency higher, the number of sampling the analog signal is increased rapidly so that the amount of digital data obtained by sampling the analog signal is increased. Accordingly, when various types of processes are carried out on the basis of the digital data obtained by sampling the analog signal, the sampling data memory having the large capacity which can memorize plenty of digital data, is required. As a result, it requires the higher cost for the sampling data memory. Further, in the above-described method, the A/D converter which can carry out the sampling of the analog signal at the high speed, becomes a necessity. Accordingly, the structure to be fit for sampling the analog signal at the high speed is also required for each part other than the A/D converter. As a result, it has required the higher cost for the structure.

In the method as disclosed in Japanese Patent Application Publication (Laid-open) No. Tokukai-hei 10-160507, on the basis of the digital data obtained by sampling the analog signal, the operation by the complementary function is carried out. Accordingly, the amount of operation has been increased remarkably, so that the longer measuring time has been required. In order to shorten the measuring time, it has required to use the hardware which can carry out the operation process at the high speed. As a result, it has required the higher cost for the hardware.

SUMMARY OF THE INVENTION

The present invention was developed in view of the above-described problems.

An object of the present invention is to provide a peak detecting device which can efficiently detect the peak of the analog signal in the much smaller error for the short time without making the sampling frequency higher, when detecting the peak of the analog signal.

In accordance with one aspect of the present invention, the peak detecting device comprises: a clock signal output member for outputting a clock signal having a predetermined frequency; a detecting member for detecting a signal level of an analog signal which is given from an outside, at a clock timing which is synchronized with the clock signal outputted from the clock signal output member; and a timing shift member for shifting the clock timing at which the signal level of the analog signal is detected by the detecting member.

According to the peak detecting device having such a structure, the clock signal output member outputs the clock signal having the predetermined frequency, the detecting member detects the signal level of the analog signal which is given from the outside, at the clock timing which is synchronized with the clock signal outputted from the clock signal output member, and the timing shift member shifts the clock timing at which the signal level of the analog signal is detected by the detecting member.

Accordingly, the timing at which the signal level of The analog signal is detected, can be changed. Consequently, when the timing at which the signal level of the analog signal is detected, is delayed greatly from one at which the peak of the analog signal is detected, it is possible to detect the signal level of the analog signal at the timing nearer one of the peak of the analog signal, by changing the timing.

Especially, when the peak detecting device is applied to the A/D converter for sampling the analog signal to generate the digital signal, the timing for sampling the analog signal can be changed easily. Therefore, when the sampling frequency is integer times as many as the frequency of the analog signal, it is possible to make the difference between the signal level of the analog signal, which is carried out the sampling and the peak value of the analog signal smaller. Accordingly, it is possible to obtain easily the digital signal which reflects the peak value of the analog signal more correctly and which has the high reliability, for the short time, without making the sampling frequency higher and carrying out the complex operation process. As a result, it is possible to require only the lower production cost as possible.

Preferably, in the above-described peak detecting device, the clock signal output member comprises a frequency-dividing member for frequency-dividing a reference clock signal which is given from an outside, by a predetermined frequency-dividing ratio to generate the clock signal, and the timing shift member changes the frequency-dividing ratio of the frequency-dividing member to shift the clock timing at which the signal level of the analog signal is detected.

According to the peak detecting device having such a structure, the frequency-dividing member of the clock signal output member frequency-divides the reference clock signal which is given from the outside, by the predetermined frequency-dividing ratio to generate the clock signal, and the timing shift member changes the frequency-dividing ratio of the frequency-dividing member to shift the clock timing at which the signal level of the analog signal is detected.

Accordingly, when the reference clock signal is frequency-divided by the frequency-dividing ratio, the clock signal is generated, and when the frequency-dividing ratio is changed by the timing shift member, the clock timing at which the signal level of the analog signal is detected is shifted.

Consequently, it is possible to provide a device having the simple structure for changing the clock timing at which the signal level of the analog signal is detected. As a result, by the peak detecting device which can be realized at the low cost, it is possible to obtain more easily the digital signal which reflects the analog signal more correctly and which has the high reliability.

Preferably, in the above-described peak detecting device, the clock signal output member comprises a frequency-dividing member for frequency-dividing a reference clock signal which is given from the outside, by a predetermined frequency-dividing ratio to generate the clock signal, and the timing shift member changes the frequency-dividing ratio of the frequency-dividing member temporarily to shift the clock timing at which the signal level of the analog signal is detected.

According to the peak detecting device having such a structure, the frequency-dividing member of the clock signal output member frequency-divides the reference clock signal which is given from the outside, by the predetermined frequency-dividing ratio to generate the clock signal, and the timing shift member changes the frequency-dividing ratio of the frequency-dividing member temporarily to shift the clock timing at which the signal level of the analog signal is detected.

Accordingly, when the frequency-dividing ratio is changed by the timing shift member, the clock timing at which the signal level of the analog signal is detected is shifted. After the clock timing is shifted temporarily, the signal level of the analog signal is detected on the basis of the clock signal having the original frequency.

Consequently, when the peak detecting device is applied to the A/D converter for sampling the analog signal to generate the digital data, it is possible to prevent the amount of digital data to be obtained by sampling from increasing remarkably or the like. Further, when the A/D converter caries out the sampling of the analog signal, it is enough only to change the sampling frequency temporarily. As a result, there is no possibility to make the process for digital data obtained by the sampling more complex.

In accordance with another aspect of the present invention, the peak detecting method comprises: a first step of outputting a clock signal having a predetermined frequency; a second step of detecting a signal level of an analog signal which is given from an outside, at a clock timing which is synchronized with the clock signal outputted at the first step; and a third step of shifting the clock timing at which the signal level of the analog signal is detected at the second step.

Preferably, in the above-described peak detecting method, in the first step, the clock signal is generated by frequency-dividing a reference clock signal which is given from an outside by a predetermined frequency-dividing ratio, and in the third step, the clock timing at which the signal level of the analog signal is detected, is shifted by changing the frequency-dividing ratio in the first step.

Preferably, in the above-described peak detecting method, in the first step, the clock signal is generated by frequency-dividing a reference clock signal which is given from an outside by a predetermined frequency-dividing ratio, and in the third step, the clock timing at which the signal level of the analog signal is detected, is shifted by changing the frequency-dividing ratio in the first step temporarily.

In accordance with a further aspect of the present invention, the peak detecting device comprises: a frequency divider for frequency-dividing a frequency of a reference clock signal which is given from an outside, by a frequency-dividing ratio, to generate a sampling clock signal; a frequency-dividing ratio setting device for outputting a frequency-dividing ratio setting signal to the frequency divider, which can change the frequency-dividing ratio of the frequency divider; an A/D converter for carrying out a sampling of an analog signal which is given from an outside, at a clock timing which is synchronized with the sampling clock signal outputted from the frequency divider; a sampling data memory for memorizing digital data which are obtained by the sampling by the A/D converter; and a data processor for reading out the digital data which are memorized in the sampling data memory to determine a peak of the digital data.

Preferably, in the peak detecting device as the above-described, when the frequency-dividing ratio is changed, the clock timing for the sampling by the A/D converter is changed, even while the A/D converter is carrying out the sampling of the analog signal.

BRIEF DESCRIPTION OF THE DRAWINGS

The present invention will be become more fully understood from the detailed description given hereinafter and the accompanying drawings which are given by way of illustration only, and thus are not intended as a definition of the limits of the present invention, and wherein:

FIG. 2 is a view showing an example of the corresponding relationship between the sampling period during which the sampling by the A/D converter 4 as shown in FIG. 1 is carried out and the change of the sampling clock signal 3a; and FIG. 3 is a view showing the state of detecting the peak of the analog input signal 1a, which is carried out by the analog signal processing apparatus 1.

PREFERRED EMBODIMENT OF THE INVENTION

Hereinafter, an embodiment of the present invention will be explained with reference to FIG. 1 to FIG. 3, as follows.

Figure 1:
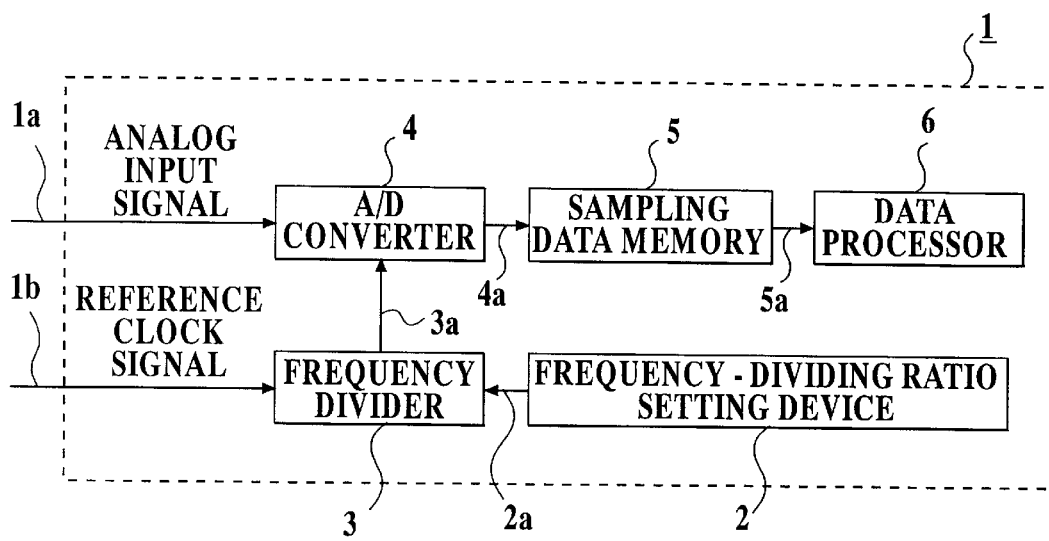
FIG. 1 is a block diagram showing a structure of an analog signal processing apparatus 1 according to an embodiment of the present invention.

FIG. 1 is a block diagram for showing the schematic structure of the analog signal processing apparatus 1 according to the embodiment of the present invention.

As shown in FIG. 1, the analog signal processing apparatus 1 as the peak detecting device of the present invention, comprises a frequency-dividing ratio setting device 2, a frequency divider 3, an A(Analog)/D(Digital) converter 4, a sampling data memory 5, a data processor 6, and the like.

Further, the analog signal processing apparatus 1 receives an analog input signal 1a as the analog signal from one of various types of measuring devices, a communication device, or the like, which is an external device connected with the analog signal processing apparatus 1 and not shown in the figures. The analog signal processing apparatus 1 receives a reference clock signal 1b from a generator or the like, which is an external device connected with the analog signal processing device 1 and not shown in the figures.

In the analog signal processing apparatus 1 as the peak detecting device of the present invention, the frequency-dividing ratio setting device 2 functions as a timing shift member, and the frequency divider 3 functions as a clock signal output member and a frequency-dividing member thereof, and the A/D converter 4 functions as a detecting member.

Further, the function of the frequency-dividing ratio setting device 2 corresponds to the first step of outputting the clock signal having the predetermined frequency, and the function of the frequency divider 3 corresponds to the second step of detecting the signal level of the analog signal which is given from the outside, at the clock timing which is synchronized with the clock signal, and the function of the A/D converter 4 corresponds to the third step of shifting the clock timing at which the signal level of the analog signal is detected.

The frequency-dividing ratio setting device 2 generates a frequency-dividing ratio setting signal 2a for changing the frequency-dividing ratio of the frequency divider 3, to output it to the frequency divider 3.

According to the frequency-dividing ratio setting signal 2a generated by the frequency-dividing ratio setting device 2, it is possible to change the frequency-dividing ratio of the frequency divider 3, even while the A/D converter 4 which will be explained as follows is carrying out the sampling.

The frequency divider 3 frequency-divides the reference clock signal 1b which is given from the outside of the analog signal processing apparatus 1, by the frequency-dividing ratio which is changed by the frequency-dividing ratio setting signal 2a inputted from the frequency-dividing ratio setting device 2. Thereby, the frequency divider 3 generates the sampling clock signal 3a to output the sampling clock signal 3a to the A/D converter 4.

Further, the frequency divider 3 detects the frequency-dividing ratio which is changed by the frequency-dividing ratio setting signal 2a inputted from the frequency-dividing ratio setting device 2, as occasion demands. Thereby, when the frequency-dividing ratio which is changed by the frequency-dividing ratio setting signal 2a, is changed, the frequency divider 3 changes the frequency-dividing ratio, even while the A/D converter 4 is carrying out the sampling.

Accordingly, while the A/D converter 4 is carrying out the sampling, it is possible to change the generating frequency of the sampling clock signal 3a.

The A/D converter 4 carries out the sampling of the analog input signal 1a which is given from the outside of the analog signal processing apparatus 1, at the clock timing which is synchronized with the sampling clock signal 3a inputted from the frequency divider 3. Accordingly, the A/D converter 4 detects the signal level of the analog input signal 1a to output the detected result thereof as the digital data 4a to the sampling data memory 5 in order.

Figure 2:
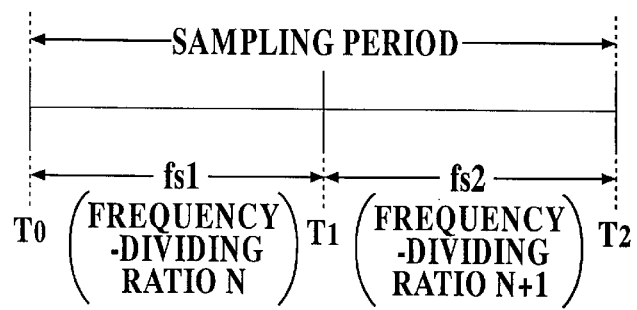

FIG. 2 is a view showing an example of corresponding relationship between the sampling period during which the sampling by the A/D converter 4 is carried out and the change of the sampling clock signal 3a.

Herein, the sampling period is a period during which the sampling of the analog input signal 1a is carried out by the A/D converter 4. In the example as shown in FIG. 2, it will be explained that the sampling by the A/D converter 4 is carried out from T0 to T2.

In the first half from T0 to T1 of the sampling period from T0 to T2 as shown in FIG. 2, the generating frequency of the sampling clock signal 3a is 'fs1'. When the frequency-dividing ratio of the frequency divider 3 is 'N', the sampling clock signal 3a having the generating frequency 'fs1' is generated by the frequency divider 3.

In the later half from T1 to T2 of the sampling period from T0 to T2 as shown in FIG. 2, the generating frequency of the sampling clock signal 3a is 'fs2'. When the frequency-dividing ratio of the frequency divider 3 is 'N+1', the sampling clock signal 3a having the generating frequency 'fs2' is generated by the frequency divider 3.

That is, in the course of the sampling period from T0 to T2 as shown in FIG. 2, the frequency-dividing ratio of the frequency divider 3 is changed from 'N' to 'N+1' at T1. With the change of the frequency-dividing ratio from 'N' to 'N+1', the generating frequency of the sampling clock signal 3a is changed from 'fs1' to 'fs2'.

Accordingly, in the analog signal processing apparatus 1, it is possible to change the generating frequency of the sampling clock signal 3a by changing the frequency-dividing ratio of the frequency divider 3, even while the A/D converter 1 is carrying out the sampling.

In the example as shown in FIG. 2, in the course of the sampling period, the frequency-dividing ratio of the frequency divider 3 is changed from 'N' to 'N+1' at T1, to change the generating frequency of the sampling clock signal 3a from 'fs1' to 'fs2'.

However, it is possible to change again the frequency-dividing ratio of the frequency divider 3 from 'N+1' to 'N', from T1 to T2. Further, the frequency-dividing ratio which is set on frequency divider 3 and the number of the change of the frequency-dividing ratio are random.

The sampling data memory 5 is a memory for memorizing temporarily the digital data 4a which are inputted from the A/D converter 4. The sampling data memory 5 comprises a semiconductor memory element and the like. The digital data 4a which are memorized in the sampling data memory 5, are outputted to the data processor 6 as the digital data 5a.

The data processor 6 is an operating processor for carrying out various types of processes on the basis of the digital data 5a inputted from the sampling data memory 5.

When the sequence of samplings by the A/D converter 4 is finished and all digital data 4a are memorized in the sampling data memory 5, the data processor 6 reads out the digital data 4a memorized in the sampling data memory 5, as the digital data 5a in order. The data processor 6 finds the maximum value and the minimum value of the digital data 5a read out from the sampling data memory 5, to determine the maximum value and the minimum value thereof to be peak values of the analog input signal 1a.

Herein, according to the above-described analog signal processing apparatus 1 having such a structure, the state of detecting the peak of the analog input signal 1a will be explained.

FIG. 3 is a view showing the state of detecting the peak of the analog input signal 1a inputted to the analog signal processing apparatus 1. Further, the FIG. 3 shows the corresponding relationship between the signal wave of the analog input signal 1a and the timing for the sampling by the analog signal processing apparatus 1.

In FIG. 3, the vertical axis shows the signal level which is the voltage value, of the analog input signal 1a and the horizontal axis shows the time.

In the example as shown in FIG. 3, the signal wave of the analog input signal 1a is the general sine wave having the predetermined generating frequency. The analog input signal 1a is carried out the sampling by the A/D converter 4 between the reference times t0 and t3, to be determined the peak value thereof.

Immediately after the sampling as shown in FIG. 3 is begun carrying out, the generating frequency of the sampling clock signal 3a from the reference time t0 is 'fs1'. Accordingly, when the sampling by the sampling frequency 'fs1' is carried out by the A/D converter 4, the signal levels of the analog input signal 1a are detected at the timings as shown in the reference numerals A1 to A6, between the reference times t0 and t1. Thereby, the digital data 4a showing detected results are memorized in the sampling data memory 5.

However, each of timings as shown in the reference numerals A1 to A6 in FIG. 3 is delayed from one at which the peak which is the maximum value or the minimum value, of the analog input signal 1a is detected.

Especially, when the generating frequency of the sampling clock signal 3a is integer times as many as the generating frequency of the analog input signal 1a, the phase between the timing for the sampling and one for the peak of the analog input signal 1a is not changed. Accordingly, the time delay between the timing for the sampling and one for the peak of the analog input signal 1a remains constant.

For example, the timing as shown in the reference numeral A1 of FIG. 3 and the timing as shown in the reference numeral A5 of FIG. 3 are delayed by the same time from one for the peak of the analog input signal 1a. Further, the time delay between the timing as shown in each of the reference numerals A1 and A5 and one for the peak of the analog input signal 1a is the smallest. Accordingly, between the reference time t0 and the reference time t1, the minimum value of the signal levels which are carried out the sampling at the timings as shown in the reference numerals A1 to A6, is the signal level which is detected at each of timings as shown in the reference numerals A1 and A5. The difference between the minimum value of the signal level and the peak value of the analog input signal 1a remains contain.

While the A/D converter 4 is carrying out the sampling, the frequency-dividing ratio of the frequency divider 3 is changed from 'N' to 'N+1' at the reference time t1. Thereby, the generating frequency of the sampling clock signal 3a which is outputted from the frequency divider 3 is changed from 'fs1' to 'fs2'.

Accordingly, the timing for the sampling by the A/D converter 4 is changed. The sampling is carried out at timings as shown in the reference numerals B1 to B6 as shown in FIG. 3. The generating frequency of the sampling clock signal 3a is changed so that the timing for the sampling is changed. As a result, the phase between the timing for the sampling and one for the peak of the analog input signal 1a is changed.

For example, when the generating frequency of the sampling clock signal 3a is not changed at the reference time t1, the sampling is carried out at the timing as shown in the reference numeral A7 next to the timing as shown in the reference numeral A6.

However, the phase is changed from the timing as shown in the reference numeral A7 to the timing as shown in the reference numeral B1, by changing the generating frequency of the sampling clock signal 3a. Accordingly, the time delay between the timing for the sampling and one for the peak of the analog input signal 1a is changed.

That is, when the sampling is carried out at the timing as shown in the reference numeral B2, the signal level detected by sampling, of the analog input signal 1a is the value around the peak value of the analog input signal 1a. The signal level is nearer the peak value of the analog input signal 1a than signal levels detected at timings as shown in the reference numerals A3, A4, and A7.

Thereafter, when the frequency-dividing ratio of the frequency divider 3 is changed from 'N+1' to 'N' at the reference time t2, the generating frequency of the sampling clock signal 3a is changed back from 'fs2' to 'fs1'. Between the reference time t2 and the reference time t3, the sampling is carried out at timings as shown in the reference numerals C1 to C5.

The timings as shown in the reference numerals C1 to C6 are synchronized with the sampling clock signal 3a having the same generating frequency to one of the sampling which is carried from the reference time t0 to the reference time t1.

However, the sampling is carried out at the timing which is synchronized with the sampling clock signal 3a having the generating frequency 'fs2', between the reference times t1 and t2. Accordingly, when the sampling is carried out at the timings as shown in the reference numerals C1 to C5, the sampling is carried out at the different phase from the timings as shown in the reference numerals A1 to A6. Consequently, the signal levels detected at the timings as shown in the reference numerals C1 to C5, are different from one detected at the timings as shown in the reference numerals A1 to A6.

For example, the signal level of the analog input signal 1a at the timing as shown in the reference numeral A7 and the signal level of the analog input signal 1a at the timing as shown in the reference numeral C1 are values around the peak of the analog input signal 1a. However, the difference in the signal level as shown in the reference numeral D, is occurred in FIG. 3.

That is, the signal level detected at the timing as shown in the reference numeral C1, is nearer the peak value of the analog input signal 1a by the signal level as shown in the reference numeral D, than the signal level detected at the timing as shown in the reference numeral A7.

Accordingly, when the frequency-dividing ratio of the frequency divider 3 is changed from 'N' to 'N+1', between the reference times t1 and t2, the phase of the timing for the sampling by the A/D converter 4 is changed. Thereby, the timing for the sampling becomes near one for the peak of the analog input signal 1a. As a result, it is possible to detect the nearer signal level to the peak value of the analog input signal 1a.

Further, after the reference time t2, the phase of the timing for the sampling by the A/D converter 4 is changed. Consequently, when the frequency-dividing ratio of the frequency divider 3 is changed back from 'N+1' to 'N', it is possible to carry out the sampling at the different timing from one of before the reference time t1.

The signal levels which were detected between the reference times t0 and t3, are memorized in the sampling data memory 5. The maximum value and the minimum value of signal levels which are memorized in the sampling data memory 5, are determined by the data processor 6. Accordingly, it is possible to detect the nearest value to the peak value of the analog input signal 1a.

As a result, when the signal level which is far from the peak value of the analog input signal 1a, is detected, it is possible to obtain the signal level near the peak value of the analog input signal 1a by changing the frequency-dividing ratio of the frequency divider 3.

Further, when the frequency-dividing ratio of the frequency divider 3 is changed from 'N' to 'N+1', the timing for the sampling by the A/D converter 4 is changed. Accordingly, the sampling clock signal 3a is not required to change extremely.

As a result, especially, the structure to be fit for sampling at the high speed is not required, so that it is possible to require only the lower production cost thereof.

In the above-described embodiment, 'N' is any integer. The specific value of 'N' is not limited. Further, the frequency-dividing ratio of the frequency divider 3 is not only changed from 'N' to 'N+1', for example, but also may have the structure being changed from 'N' to 'N+3'. The change of frequency-dividing ratio of the frequency divider 3 is not limited specially.

As described above, according to the analog signal processing apparatus 1 as the embodiment of the present invention, the analog signal processing apparatus 1 comprises: the frequency-dividing ratio setting device 2 for outputting the frequency-dividing ratio setting signal 2a to the frequency divider 3, which can change the frequency-dividing ratio of the frequency divider 3; the frequency divider 3 for frequency-dividing the frequency of the reference clock signal 1b by the frequency-dividing ratio which is changed by the frequency-dividing ratio setting signal 2a, to generate the sampling clock signal 3a; the A/D converter 4 for carrying out the sampling of the analog input signal 1a at the clock timing which is synchronized with the sampling clock signal 3a outputted from the frequency divider 3; the sampling data memory 5 for memorizing the digital data 4a which are obtained by sampling by the A/D converter 4; and the data processor 6 for reading out the digital data 4a which are memorized in the sampling data memory 5 as the digital data 5a, to determine the peak of the digital data 5a, wherein when the frequency-dividing ratio of the frequency divider 3 is changed, the generating frequency of the sampling clock signal 3a is changed, even while the A/D converter 4 is carrying out the sampling of the analog input signal 1a, and the phase of the timing for the sampling by the A/D converter 4 is changed.

Accordingly, when the timing for the sampling by the A/D converter 4 is delayed from one for the peak of the analog input signal 1a, it is possible to change the timing for the sampling by the A/D converter 4 near one for the peak of the analog input signal 1a. As a result, it is possible to improve easily the accuracy of sampling the analog input signal 1a and to obtain the digital data which reflect more correctly the signal level of the analog input signal 1a for the short time, without making the sampling frequency higher and carrying out the complex operation process.

Further, when the degree of change of the signal level of the sampling clock signal 3a is comparatively small, it is possible to have the enough effect of the present invention. Accordingly, the structure to be fit for sampling the analog signal at the high speed is not required for each part of the analog signal processing apparatus 1. As a result, it is possible to realize the analog signal processing apparatus 1 of the present invention easily, at the low production cost.

Especially, when the generating frequency of the sampling clock signal 3a is integer times as many as the generating frequency of the analog input signal 1a, it is not possible to expect to improve the quality of digital data which are obtained by the conventional A/D converter 4.

However, according to the analog signal processor apparatus 1 of the present invention, when the generating frequency of the sampling clock signal 3a is changed slightly and the phase thereof is changed, it is possible to easily obtain the digital data which reflect correctly the signal level of the analog input signal 1a.

In the analog signal processing apparatus 1, when the frequency-dividing ratio of the frequency divider 3 is changed temporarily by the frequency-dividing ratio setting signal 2a, and after, changed back to the original frequency-dividing ratio, it is possible to change the timing for the sampling the analog signal by the A/D converter 4.

Accordingly, it is possible to make the process by the data processor 6 simpler and to carry out the process for the shorter time.

In the analog signal processing apparatus 1, it is possible to have the above-described enough effect only by increasing the frequency-dividing ratio of the frequency divider 3 by '1'.

Accordingly, it is possible to make the frequency-dividing ratio setting device 2 have very much simpler structure and to realize it at the lower production cost.

In the analog signal processing apparatus 1 having such a structure as the above-described embodiment, when the frequency-dividing ratio of the frequency divider 3 is changed by the frequency-dividing ratio setting signal 2a outputted from the frequency-dividing ratio setting device 2, the phase of the timing for the sampling by the A/D converter 4 is changed. However, the present invention is not limited to this structure.

For example, the frequency divider 3 may function as the frequency divider for frequency-dividing by the constant frequency-dividing ratio. Further, the phase shifter for changing the timing for the sampling by the A/D converter 4 may function as the timing shift member for changing the clock timing at which the signal level of the analog signal is detected. That is, the phase of the timing for the sampling is changed without changing the frequency of sampling by the A/D converter 4. Consequently, it is possible to have the same effect as well as one by the above-described embodiment.

Further, in the analog signal processing apparatus 1 of the above-described embodiment, it is possible to modify another detailed structure, as occasion demands.

The entire disclosure of Japanese Patent Application No. Tokugan-hei 11-86773 filed on Mar. 29, 1999 including specification, claims, drawings and summary are incorporated herein by reference in its entirety.

According to the present invention, some effects will be explained, as follows.

When the timing at which the signal level of the analog input signal is detected, is delayed greatly from one at which the peak of the analog input signal is detected, it is possible to detect the signal level at the timing nearer one for the peak of the analog input signal, by changing the timing.

Especially, when the peak detecting device and the peak detecting method are applied to the A/D converter for sampling the analog signal to generate the digital data, it is possible to change the timing for the sampling easily, even when the sampling frequency is integer times as many as the frequency of the analog signal. Further, it is possible to make the difference between the signal level carried out the sampling and the peak value of the analog signal smaller.

Accordingly, it is possible to easily obtain the digital signal which reflects the peak value of the analog signal more correctly and has the high reliability, for the short time, without making the sampling frequency higher and carrying out the complex operation process. As a result, it is possible to require only the lower production cost.

When the reference clock signal which is given the outside is frequency-divided, the generating signal is generated. When the frequency-dividing ratio is changed, the timing at which the signal level of the analog signal is detected, is changed. Accordingly, it is possible to make the apparatus for shifting the timing have the simpler structure.

Consequently, it is possible to more easily obtain the digital signal which reflects the analog signal more correctly and has the high reliability, by the peak detecting device which can be realized at the low cost.

When the frequency-dividing ratio is changed temporarily, the timing at which the signal level of the analog signal is detected, is changed. Therefore, after the timing is changed, the signal level of the analog signal is detected on the basis of the generating signal having the original frequency.

Accordingly, when the peak detecting device and the peak detecting method are applied to the A/D converter for sampling the analog signal to generate the digital data, it is possible to prevent the amount of digital data obtained by sampling from increasing remarkably. Further, when the analog signal is carried out the sampling, it is possible to have the enough effect only by changing the sampling frequency temporarily. As a result, the process for the digital data obtained by sampling is not complex.

What is claimed is:

1. An apparatus for peak detection of an analog signal, the apparatus comprising;
    a frequency divider for frequency-dividing a frequency of a reference clock signal by a frequency-dividing ratio, to generate a sampling clock signal;
    a frequency-dividing ratio setting device for outputting a frequency-dividing ratio setting signal capable of changing the frequency-dividing ratio, to the frequency divider;
    an A/D converter for sampling an analog signal at a clock timing which is synchronized with the sampling clock signal, to generate digital data;
    a memory for storing digital data generated by the A/D converter; and
    a data processor for selecting a maximum value and a minimum value among the digital data which is stored in the memory, to determine peaks of the analog signal, based on the maximum value and the minimum value.

2. An apparatus for peak detection of an analog signal, as claimed in claim 1,
    wherein, the clock timing is changed by changing the frequency-dividing ratio, even while the A/D converter is sampling the analog signal.

3. An apparatus for peak detection of an analog signal, as claimed in claim 1,
    wherein the frequency-dividing ratio setting device outputs the frequency-dividing ratio setting signal capable of temporarily changing the frequency-dividing ratio, to the frequency divider.

4. A method for peak detection of an analog signal, the method comprising;
    frequency-dividing a frequency of a reference clock signal by a frequency-dividing ratio, to generate a sampling clock signal;
    outputting a frequency-dividing ratio setting signal capable of changing the frequency-dividing ratio;
    sampling an analog signal at a clock timing which is synchronized with the sampling clock signal, to generate digital data;
    memorizing the digital data generated, in a memory; and
    selecting a maximum value and a minimum value among the digital data which is memorized in the memory, to determine peaks of the analog signal, based on the maximum value and the minimum value.

5. A method for peak detection of an analog signal, as claimed in claim 4, the method further comprising:
    changing the clock timing by changing the frequency-dividing ratio, even while the analog signal is sampled.

6. A method for peak detection of an analog signal, as claimed in claim 4, the method further comprising:
    outputting the frequency-dividing ratio setting signal capable of temporarily changing the frequency-dividing ratio.

* * * * *